United States Patent [19]

Duncan

[11] 4,004,256
[45] Jan. 18, 1977

[54] HIGH FREQUENCY AMPLIFIER STAGE WITH INPUT REFERENCE TRANSLATION AND OUTPUT MATCHING

[76] Inventor: David M. Duncan, P.O. Box 97, Main Post Office, San Francisco, Calif. 94101

[22] Filed: July 16, 1975

[21] Appl. No.: 596,362

Related U.S. Application Data

[63] Continuation-in-part of Ser. No. 477,991, June 10, 1974, abandoned.

[52] U.S. Cl. .............................. 333/32; 330/38 M; 330/53; 333/84 M
[51] Int. Cl.[2] .......................................... H03H 7/38
[58] Field of Search .................... 330/38 M, 53, 56; 333/32, 33, 84 M; 357/74, 81, 84; 174/52 FP

[56] References Cited

UNITED STATES PATENTS

| 3,577,181 | 5/1971 | Belohoubek | 333/84 M |
| 3,745,487 | 7/1973 | Milard et al. | 333/33 X |
| 3,825,805 | 7/1974 | Belohoubek et al. | 333/84 M X |
| 3,838,443 | 9/1974 | Laighton | 333/84 M X |
| 3,869,677 | 3/1975 | Belohoubek et al. | 333/84 M X |

*Primary Examiner*—Paul L. Gensler
*Attorney, Agent, or Firm*—Flehr, Hohbach, Test, Albritton & Herbert

[57] ABSTRACT

High frequency amplifier stage having a transistor operating in either a common base or a common emitter mode, with the collector connected directly to a ground plane. A transmission line connected to the input of the transistor translates the reference point of an input signal from the ground plane to the common terminal of the transistor and provides output matching for the transistor.

12 Claims, 4 Drawing Figures

U.S. Patent   Jan. 18, 1977   4,004,256
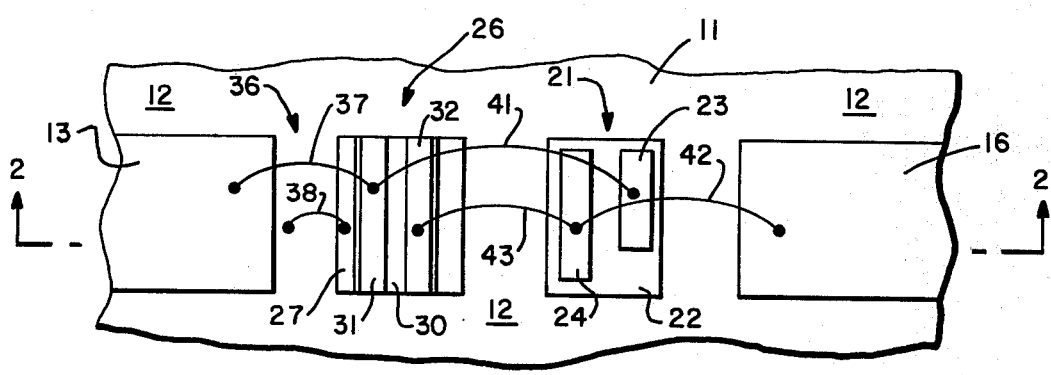
FIG—1
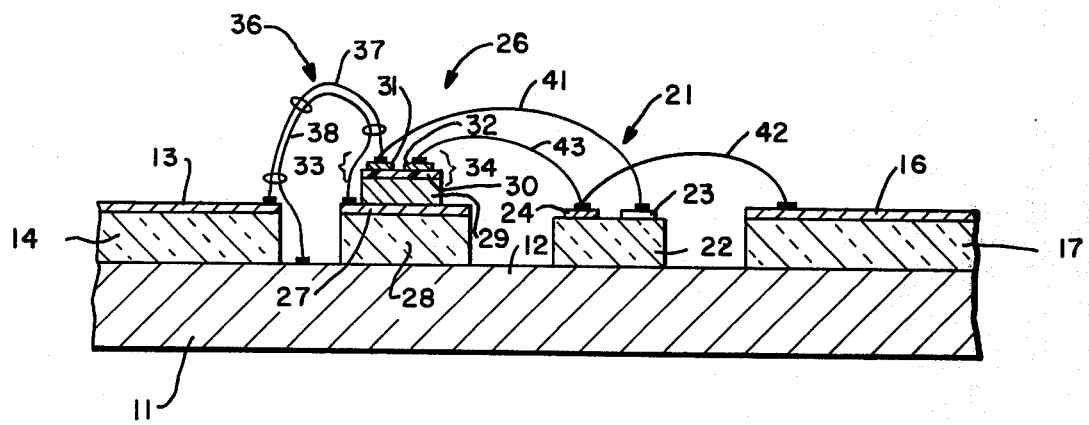
FIG.—2
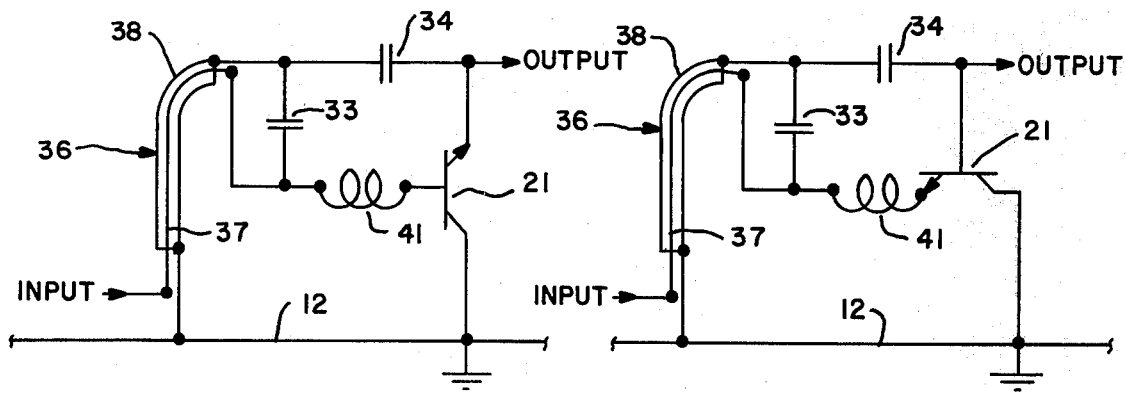
FIG.—3   FIG.—4

HIGH FREQUENCY AMPLIFIER STAGE WITH INPUT REFERENCE TRANSLATION AND OUTPUT MATCHING

CROSS-REFERENCE TO RELATED APPLICATION

This is a continuation-in-part of application Ser. No. 477,991, filed June 10, 1974, now abandoned.

BACKGROUND OF THE INVENTION

This invention pertains generally to amplifier stages and more particularly to a matched amplifier stage for use in high frequency applications such as microwave circuits.

At frequencies on the order of 200 Mhz or higher, transistors have very low input and output impedances, e.g. 1 ohm or less, which must be interfaced with the higher impedances of circuits in which the transistors are typically used. In the past, some transistors have been packaged with input and output matching networks in the transistor housing in order to raise the input and output impedances and thereby simplify circuit design.

Although successful commercially, transistors heretofore provided with integral matching networks are subject to certain disadvantages which will become more significant as the state of the art advances. Because of the space limitations imposed by present packaging techniques, output matching network connections are generally made to the transistor body at points spaced laterally from the signal output leads, and as a consequence there is a significant flow of output current in the transistor body and metalization attached thereto in a direction perpendicular to the normal current flow. This results in different phase angles for signal voltages along the transistor, with a corresponding reduction in efficiency. Moreover, since the body of most transitor dice is the collector, which is utilized as the output terminal, the thermal resistance of the device is limited because an electrical insulator, such as beryllia, must be used between the collector of the device and a grounded heat sink.

SUMMARY AND OBJECTS OF THE INVENTION

The invention provides a matched amplifier stage in which the collector of a transistor is connected directly to a grounded substrate. The transistor can be operated in either a common emitter or a common base mode, and a transmission line on the input side of the transistor serves the dual function of providing the output matching for the transistor and changing the reference point for an input signal from the substrate to the common terminal of the transistor.

It is in general an object of the invention to provide a new and improved amplifier stage for use in high frequency applications.

Another object of the invention is to provide an amplifier stage of the above character having an improved matching network.

Another object of the invention is to provide an amplifier stage of the above character having an active device electrically and thermally connected to a ground plane common to the input and output circuits.

Additional objects and features of the invention will be apparent from the following description in which the preferred embodiments are set forth in detail in conjunction with the accompanying drawings.

BRIEF DESCRIPTION OF THE DRAWINGS

FIG. 1 is an enlarged fragmentary top plan view of one embodiment of an amplifier stage according to the invention.

FIG. 2 is a cross-sectional view taken along line 2—2 of FIG. 1.

FIG. 3 is a circuit diagram of the embodiment of FIGS. 1 and 2.

FIG. 4 is a circuit diagram of a second embodiment of an amplifier stage according to the invention.

DESCRIPTION OF THE PREFERRED EMBODIMENT

As illustrated in FIGS. 1 and 2, the amplifier stage includes a generally planar substrate 11 which, in the preferred embodiment, is fabricated of a thermally and electrically conductive material such as copper. The upper surface 12 of the substrate serves as a ground plane for the stage. A planar input conductor 13 extends in a direction generally parallel to the ground plane and is separated therefrom by an insulating layer 14 to form an input line of a type commonly known as a strip line or microstrip. Similarly, a generally planar output conductor 16 is separated from the ground plane by an insulating layer 17 to form an output line, with the ground plane being common both to the input and output lines.

A three terminal active device 21, such as a transistor, is mounted on the substrate between the input and output lines. As illustrated, the transistor includes a body 22 which serves as a collector and is mounted directly on ground plane 12, making electrical and thermal contact therewith. The transistor also has base and emitter regions 23, 24 which are illustrated as electrodes at the upper surface of the collector.

A dual capacitor 26 is mounted on the substrate between the input line and transistor 21. The capacitor can be formed by conventional MOS techniques and is mounted on a electrically conductive plate 27 which is separated from ground plane 12 by an insulator 28. A chip 29 of highly conductive silicon is mounted on plate 27 in electrical contact therewith. A dielectric layer 30, such as an oxide layer, is formed on the upper surface of the silicon chip and conductive plates 31, 32 are provided at the upper surface of the dielectric layer. These plates cooperate with chip 29 to form capacitors 33, 34, respectively, with the chip serving as a common plate for the capacitors. Undesired capacitants between plate 27 and ground plane 12 can be minimized by known techniques, such as proper selection of the thickness and dielectric properties of insulator 28.

Input connections to transistor 21 are made through a transmission line 36 and capacitors 33, 34. The transmission line includes a first lead 37 which extends between input conductor 13 and plate 31 of capacitor 33 and a second lead which extends between ground plane 12 and the common plate of the capacitors. A first bond wire 41 extends between plate 31 and the base 23 of the transistor, and a second bond wire 42 connects the emitter to output conductor 16. An additional bond wire 43 is connected between capacitor plate 32 and the emitter 24 of the transistor. Thus, in this embodiment, the emitter is common to the input and output circuits of the transistor, and capacitor 34 is connected in series with transmission line lead 38 between the ground plane and the common terminal of the transistor. It will be understood, however, that the roles of the base and the emitter can be interchanged and that the transistor can be operated in either a common emitter or a common base mode.

Transmission line 36 serves the dual function of translating the reference point for input signals from the ground plane to the common terminal of the transistor and providing output matching for the transistor. The transmission line can be of any suitable configuration in which leads 37, 38 are coupled together closely, such as a coaxial cable or closely interleaved bond wires. The length of the transmission line is preferably substantially shorter than ¼-wavelength at the frequency of operation. Lead 38 has a predetermined inductance which, in the preferred embodiment, is made to resonate with the output capacitance of the transistor to provide the desired output matching.

Input matching is provided by a network comprising capacitor 33 and the inductance of bond wire 41. By utilizing a transmission line having a higher characteristic impedance than the input impedance of the network formed by capacitor 33 and inductor 41, the transmission line also serves as an additional section of input matching. Capacitor 34 serves as a blocking capacitor.

The circuit of the amplifier stage of FIGS. 1 and 2 is illustrated schematically in FIG. 3, with like reference numerals designating like elements. As noted above, the emitter of transistor 21 is common to the input and output circuits in this embodiment, and transmission line 36 serves to translate the reference point of the input signal from ground plane 12 to the emitter of the transistor.

FIG. 4 illustrates an embodiment in which the transistor operates in a common base mode, and the transmission line changes the input reference from the ground plane to the base of the transistor. Except for the interchanged roles of the emitter and base, the embodiment of FIG. 4 is similar to the embodiment previously described, and like reference numerals are used to designate corresponding elements.

The amplifier stage of the invention has a number of important features and advantages. As noted above, the transmission line serves the dual function of providing output matching and translating the input reference point from the ground plane to the common terminal of the transistor. The collector is connected directly to the ground plane, thereby providing good beat dissipation and maximum performance in the transistor. The transmission line can also be utilized to provide input matching, and the entire device can be mounted in a conventional transistor housing. While only a single stage has been shown, a plurality of stages can be cascaded, if desired.

It is apparent from the foregoing that a new and improved high frequency amplifier stage has been provided. While only the presently preferred embodiments have been described, as will be apparent to those familiar with the art, certain changes and modifications can be made without departing from the scope of the invention as defined by the following claims.

What is claimed is:

1. In an amplifier stage: a substrate having a generally planar surface at ground potential, a first conductor spaced from the surface of the substrate and forming therewith an input line, a second conductor spaced from the surface of the substrate and forming therewith an output line, a transistor having emitter, base and collector electrodes, the collector electrode being mounted directly on the surface of the substrate and connected electrically thereto, a transmission line having a first lead connected between the first conductor and a second one of the electrodes and a second lead connected between the substrate and the third one of the electrodes whereby input signals from the input line are applied to the second and third electrodes of the transistor, and means connecting the third electrode of the transistor to the second conductor whereby output signals are applied to the output line from the third electrode and the collector electrode of the transistor, the third electrode being common to the input and output circuits.

2. The amplifier stage of claim 1 wherein the second lead has a predetermined inductance forming a tuned circuit with the output capacitance of the transistor, thereby providing output matching for the transistor.

3. The amplifier stage of claim 1 further including a blocking capacitor connected electrically in series with the second lead of the transmission line.

4. The amplifier stage of claim 1 further including a matching network connected between the transmission line and the transistor to provide input matching for the transistor.

5. The amplifier stage of claim 1 wherein the electrode common to the input and output circuits is the base electrode.

6. The amplifier stage of claim 1 wherein the common electrode is the base electrode.

7. In an amplifier stage: a common conductor, an input conductor insulated from the common conductor and forming therewith an input line, an output conductor insulated from the common conductor and forming therewith an output line, an active device having an input terminal, an output terminal, and a common terminal, the output terminal of the active device being connected to the common conductor, a first conductor connected between the input conductor and the input of the active device, a second conductor and a DC blocking element connected between the common terminal of the active device and the common conductor, and means connecting the common terminal of the active device to the output conductor, the second conductor having a predetermined inductance and being closely coupled to the first conductor whereby the second conductor serves the dual function of providing output matching for the active device and changing the reference point of a signal applied to the input line from the common conductor to the common terminal of the active device.

8. The amplifier stage of claim 7 wherein the inductance of the second conductor is made to resonate with the internal capacitance between the output and common terminals of the active device.

9. The amplifier stage of claim 7 wherein the active device is a transistor and the output terminal is the collector of the transistor.

10. The amplifier stage of claim 7 wherein the first and second conductors are the conductors of a transmission line having a length substantially shorter than one quarter wavelength at the operating frequency of the amplifier stage.

11. The amplifier stage of claim 10 together with an input matching network connected between the transmission line and the input and common terminals of the active device.

12. The amplifier stage of claim 11 wherein the impedance of the transmission line is higher than the input impedance of the matching network.

* * * * *